(12) United States Patent
Liu (10) Patent No.: US 10,347,838 B2
(45) Date of Patent: Jul. 9, 2019

(54) MANUFACTURING METHOD FOR THIN FILM TRANSISTORS AND DISPLAY PANEL

(71) Applicant: WUHAN CHINA STAR OPTOELECTRONICS TECHNOLOGY CO., LTD., Wuhan (CN)

(72) Inventor: Zhe Liu, Wuhan (CN)

(73) Assignee: WUHAN CHINA STAR OPTOELECTRONICS, TECHNOLOGY CO., LTD, Wuhan (CN)

(*) Notice: Subject to any disclaimer, the term of this patent is extended or adjusted under 35 U.S.C. 154(b) by 0 days.

(21) Appl. No.: 15/525,089

(22) PCT Filed: Mar. 10, 2017

(86) PCT No.: PCT/CN2017/076314
§ 371 (c)(1),
(2) Date: May 8, 2017

(87) PCT Pub. No.: WO2018/149000
PCT Pub. Date: Aug. 23, 2018

(65) Prior Publication Data
US 2018/0351103 A1 Dec. 6, 2018

(30) Foreign Application Priority Data
Feb. 20, 2017 (CN) .......................... 2017 1 0091596

(51) Int. Cl.
| H01L 51/05 | (2006.01) |
| H01L 27/32 | (2006.01) |
| H01L 51/00 | (2006.01) |
| G03F 7/00 | (2006.01) |
| H01L 21/77 | (2017.01) |
| H01L 29/66 | (2006.01) |

(52) U.S. Cl.
CPC ........ *H01L 51/0013* (2013.01); *G03F 7/0002* (2013.01); *H01L 21/77* (2013.01); *H01L 27/3265* (2013.01); *H01L 29/66742* (2013.01); *H01L 51/0014* (2013.01); *H01L 51/0017* (2013.01); *H01L 51/0566* (2013.01); *H01L 27/3274* (2013.01); *H01L 51/0541* (2013.01); *H01L 2251/105* (2013.01)

(58) Field of Classification Search
None
See application file for complete search history.

(56) References Cited

U.S. PATENT DOCUMENTS

| 2002/0179449 A1* | 12/2002 | Domeier | B29C 33/3857 205/67 |
| 2005/0008880 A1* | 1/2005 | Kunze | C09D 11/52 428/447 |
| 2007/0287270 A1* | 12/2007 | Li | H01L 21/0337 438/478 |

* cited by examiner

*Primary Examiner* — Alexander G Ghyka
(74) *Attorney, Agent, or Firm* — Soroker Agmon Nordman (57) ABSTRACT

The present disclosure provides a manufacturing method for thin film transistors and a display panel, in which a semiconductor channel layer is formed by embossing on a semiconductor solution material directly by using an embossing template having a semiconductor channel layer pattern, thus it does not need to form a photoresist layer on the semiconductor solution material to form a semiconductor channel layer, the erosion of the semiconductor channel layer caused by the photoresist can be avoided, thereby the product quality and the device performance are improved.

20 Claims, 4 Drawing Sheets

MANUFACTURING METHOD FOR THIN FILM TRANSISTORS AND DISPLAY PANEL

BACKGROUND OF THE INVENTION

Field of Invention

The present disclosure relates to the field of semiconductor manufacturing technology, and particularly to a manufacturing method for thin film transistors and a display panel.

Description of Prior Art

The driving methods of a display panel are usually divided into active driving and passive driving. Compared with passive driving, active driving can achieve high brightness, high resolution, and lower power consumption; furthermore, the panel can easily achieve colorization, and current display panels almost are active driving panels.

Active driving means that each pixel is provided with a thin film transistor (TFT) having a switching function, and the display data is selected for the corresponding pixels by an ON/OFF switching operation of the TFT. Therefore, in a display panel using active driving, it is necessary to form more TFTs. In the structure of a thin film transistor, there is generally a gate electrode layer, a source electrode layer, and a drain electrode layer, wherein a semiconductor channel layer is provided between the source electrode layer and the drain electrode layer, and an insulation layer is formed between the gate electrode layer and the source electrode layer and formed between the gate electrode layer and the drain electrode layer.

Conventionally, the steps for forming the semiconductor channel layer are usually: a semiconductor layer is obtained by coating and curing on the source electrode layer and the drain electrode layer; a photoresist layer is formed on the semiconductor layer; the photoresist layer is exposed to ultra violet (UV) light by a photo mask having a semiconductor channel layer pattern, and the photoresist layer that is not irradiated is removed by a development process to expose the semiconductor layer under the photoresist layer. The exposed semiconductor layer is removed by etching or the like, then, the remaining photoresist layer is removed by a development process, thereby a semiconductor channel layer is obtained.

However, in the above-described method, direct contact between the photoresist layer and the semiconductor layer easily causes the surface of the semiconductor layer to be eroded, thereby the contact between the semiconductor channel layer and the dielectric insulation layer formed thereon adversely affects the device performance.

SUMMARY OF THE INVENTION

An object of the present disclosure is to provide a manufacturing method for thin film transistors and a display panel, which is capable of preventing the surface of a semiconductor channel layer from being eroded by a photoresist layer and improving the device performance.

The present disclosure provides a manufacturing, method for thin film transistors, which comprises:

A baseplate and an embossing template are provided. The embossing template has recess portions having the same shape as a shape of a semiconductor channel layer.

A source electrode layer and a drain electrode layer are formed on the baseplate.

A semiconductor solution material is coated on the source electrode layer, the drain electrode layer, and a portion of the baseplate that is not covered by the source electrode layer and the drain electrode layer.

The semiconductor solution material is pre-cured.

When a predetermined position to form the semiconductor channel layer on the source electrode layer and the drain electrode layer is determined, the recess portions of the embossing template are aligned with the predetermined position.

The embossing template is pressed onto the pre-cured semiconductor solution material to remove semiconductor solution material other than the semiconductor solution material located within the recess portions, thereby protrusions of semiconductor solution material are correspondingly formed in the shape of the recess portions.

The protrusions are cured and the embossing template and the baseplate are separated to form the semiconductor channel layer on the source electrode layer and the drain electrode layer.

A surface of the semiconductor channel layer and a surface of the baseplate are etched.

A first insulation layer and a gate electrode layer are sequentially formed on the semiconductor channel layer after the etching process.

In the manufacturing method of the present disclosure, at least one of the baseplate and the embossing template is formed with flow-through portions so that the semiconductor solution material flows out from the flow-through portion when the embossing template is pressed onto the semiconductor solution material.

In the manufacturing method of the present disclosure, the step of aligning the recess portions of the embossing template with the predetermined position comprises: the recess portions of the embossing template are aligned with the predetermined position under vacuum conditions;

The step of pressing the embossing template onto the semiconductor solution material comprises: the embossing template is pressed onto the semiconductor solution material under vacuum conditions.

In the manufacturing method of the present disclosure, the step of providing a substrate and an embossing template comprises:

A pattern of the semiconductor channel layer is formed on a hard substrate;

An organic high molecular material is coated and cured on the hard substrate on which the pattern is formed.

The organic high molecular material after curing is separated from the hard substrate, the cured organic high molecular material is formed with the recess portion corresponding to the shape of the pattern to form the embossing template.

In the manufacturing method of the present disclosure, the embossing template has elasticity.

In the manufacturing method of the present disclosure, the step of curing the protrusions comprises: the protrusions on one side one back side of the baseplate against the protrusions is heated to cure the protrusions.

The present disclosure provides another manufacturing method for thin film transistors, which comprises:

A baseplate and an embossing template are provided. The embossing template has recess portions having the same shape as a shape of a semiconductor channel layer.

A source electrode layer and a drain electrode layer are formed on the baseplate.

A semiconductor solution material is coated on the source electrode layer, the drain electrode layer, and a portion of the baseplate that is not covered by the source electrode layer and the drain electrode layer.

When a predetermined position to form the semiconductor channel layer on the source electrode layer and the drain electrode layer is determined, the recess portions of the embossing template are aligned with the predetermined position.

The embossing template is pressed onto the semiconductor solution material to remove semiconductor solution material other than the semiconductor solution material located within the recess portions, thereby protrusions of semiconductor solution material are correspondingly formed in the shape of the recess portions.

The protrusions are cured and the embossing template and the baseplate are separated to form the semiconductor channel layer on the source electrode layer and the drain electrode layer.

A first insulation layer and a gate electrode layer are sequentially formed on the semiconductor channel layer.

In the manufacturing method of the present disclosure, after separating the embossing template from the baseplate, the manufacturing method further comprises: a surface of the semiconductor channel layer and a surface of the baseplate are etched.

In the manufacturing method of the present disclosure, after the step of coating a semiconductor solution material on the source electrode layer, the drain electrode layer, and a portion of the baseplate that is not covered by the source electrode layer and the drain electrode layer, the manufacturing method further comprises: the semiconductor solution material is pre-cured.

In the manufacturing method of the present disclosure, at least one of the baseplate and the embossing template is formed with flow-through portions so that the semiconductor solution material flows out from the flow-through portion when the embossing template is pressed onto the semiconductor solution material.

In the manufacturing method of the present disclosure, the step of aligning the recess portions of the embossing template with the predetermined position comprises: the recess portion of the embossing template are aligned with the predetermined position under vacuum conditions;

The step of pressing the embossing template onto the semiconductor solution material comprises: the embossing template is pressed onto the semiconductor solution material under vacuum conditions.

In the manufacturing method of the present disclosure, the step of providing a substrate and an embossing template comprises:

A pattern of the semiconductor channel layer is formed on a hard substrate;

An organic high molecular material is coated and cured on the hard substrate on which the pattern is formed.

The organic high molecular material after curing is separated from the hard substrate, the cured organic high molecular material is formed with the recess portions corresponding to the shape of the pattern to form the embossing template.

In the manufacturing method of the present disclosure, the embossing template has elasticity.

In the manufacturing method of the present disclosure, the step of curing the protrusions comprises: one back side of the baseplate against the protrusions is heated to cure the protrusions.

The present disclosure provides a manufacturing method for a display panel, the display panel comprises thin film transistors, the manufacturing method comprises:

A baseplate and an embossing template are provided. The embossing template has recess portions having the same shape as a shape of a semiconductor channel layer.

A source electrode layer and a drain electrode layer are formed on the baseplate.

A semiconductor solution material is coated on the source electrode layer, the drain electrode layer, and a portion of the baseplate that is not covered by the source electrode layer and the drain electrode layer.

When a predetermined position to form the semiconductor channel layer on the source electrode layer and the drain electrode layer is determined, the recess portions of the embossing template are aligned with the predetermined position.

The embossing template is pressed onto, the semiconductor solution material to remove semiconductor solution material other than the semiconductor solution material located within the recess portions, thereby protrusions of semiconductor solution material are correspondingly formed in the shape of the recess portions.

The protrusions are cured and the embossing template and the baseplate are separated to form the semiconductor channel layer on the source electrode layer and the drain electrode layer.

A first insulation layer and a gate electrode layer are sequentially formed on the semiconductor channel layer.

In the manufacturing method of the present disclosure, after separating the embossing template from the baseplate, the manufacturing method further comprises: a surface of the semiconductor channel layer and a surface of the baseplate are etched.

In the manufacturing method of the present disclosure, after the step of coating a semiconductor solution material on the source electrode layer, the drain electrode layer, and a portion of the baseplate that is not covered by the source electrode layer and the dram electrode layer, the manufacturing method further comprises: the semiconductor solution material is pre-cured.

In the manufacturing method of the present disclosure, at least one of the baseplate and the embossing template is formed with flow-through portions so that the semiconductor solution material flows out from the flow-through portion when the embossing template is pressed onto the semiconductor solution material.

In the manufacturing method of the present disclosure, the step of aligning the recess portions of the embossing template with the predetermined position comprises: the recess portion of the embossing template are aligned with the predetermined position under vacuum conditions;

The step of pressing the embossing template onto the semiconductor solution material comprises: the embossing template is pressed onto the semiconductor solution material under vacuum conditions.

In the manufacturing method of the present disclosure, the step of forming a source electrode layer and a drain electrode layer on the baseplate further comprises: a capacitor lower plate is formed on the baseplate.

The step of sequentially forming a first insulation layer and a gate electrode layer on the semiconductor channel layer, comprises:

The first insulation layer is formed on the semiconductor channel layer and the source electrode layer, the drain electrode layer, the substrate, and the capacitor lower plate which is not covered by the semiconductor channel layer.

A first through hole is formed in the first insulation layer on the source electrode layer and a second through hole is formed in the first insulation layer on the drain electrode layer.

A capacitor upper plate is formed on the first insulation layer corresponding to the capacitor lower plate and is connected to the source electrode layer through the first through hole.

The gate electrode layer is formed on the first insulation layer corresponding to the semiconductor channel layer.

The step of sequentially forming a first insulation layer and a gate electrode layer on the semiconductor channel layer comprises:

A second insulation layer is formed on the gate electrode layer, the first insulation layer not covered by the gate electrode layer and the capacitor upper plate. And the second insulation layer is formed with a third through hole connecting to the second insulation layer.

A transparent electrode layer is formed on the second insulation layer and connects to the transparent electrode layer to the drain electrode layer successively through the third through hole and the second through hole.

Compared with the conventional manufacturing method, the thin film transistors of the present disclosure are formed by embossing directly on a semiconductor solution material using an embossing template having a pattern of a semiconductor channel layer so as to form a semiconductor channel layer without performing photolithography, which can avoid the erosion caused by the photoresist layer on the semiconductor channel layer, then the device performance is improved.

In order to make the foregoing of the present disclosure more clear, the preferred embodiments are given hereinafter and are to be described in detail with reference to the accompanying drawings:

BRIEF DESCRIPTION OF THE DRAWINGS

The technical proposals of the present disclosure and other advantageous effects will be apparent from the following detailed description of specific embodiments of the present disclosure taken in conjunction with the accompanying drawings.

DETAILED DESCRIPTION OF THE PREFERRED EMBODIMENTS

The following description of each embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure.

In the FIGS., elements with similar structures are denoted by the same numerals.

Figure 1:
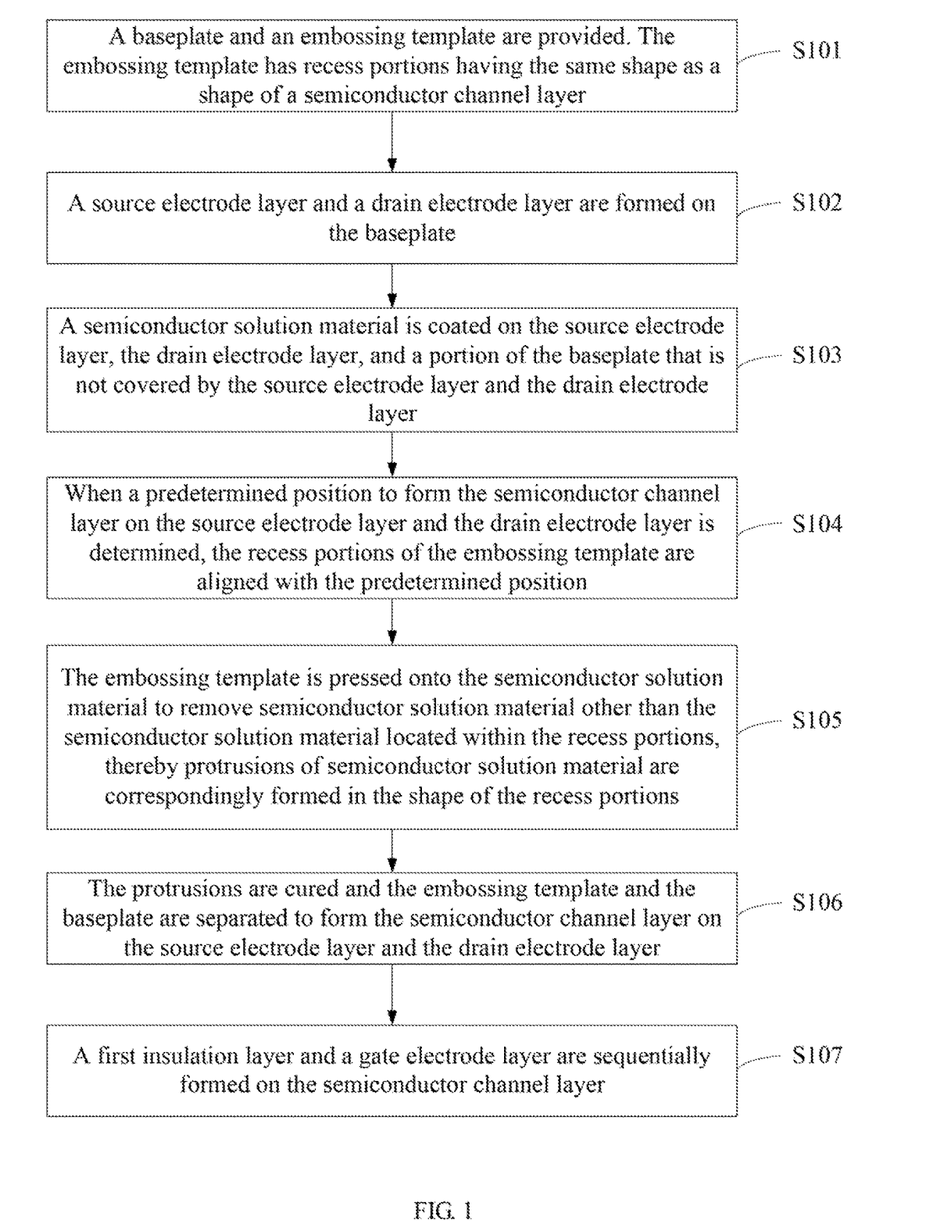
FIG. 1 is a flow chart of an embodiment of a manufacturing method for a display panel according to the present disclosure.
Figure 2:
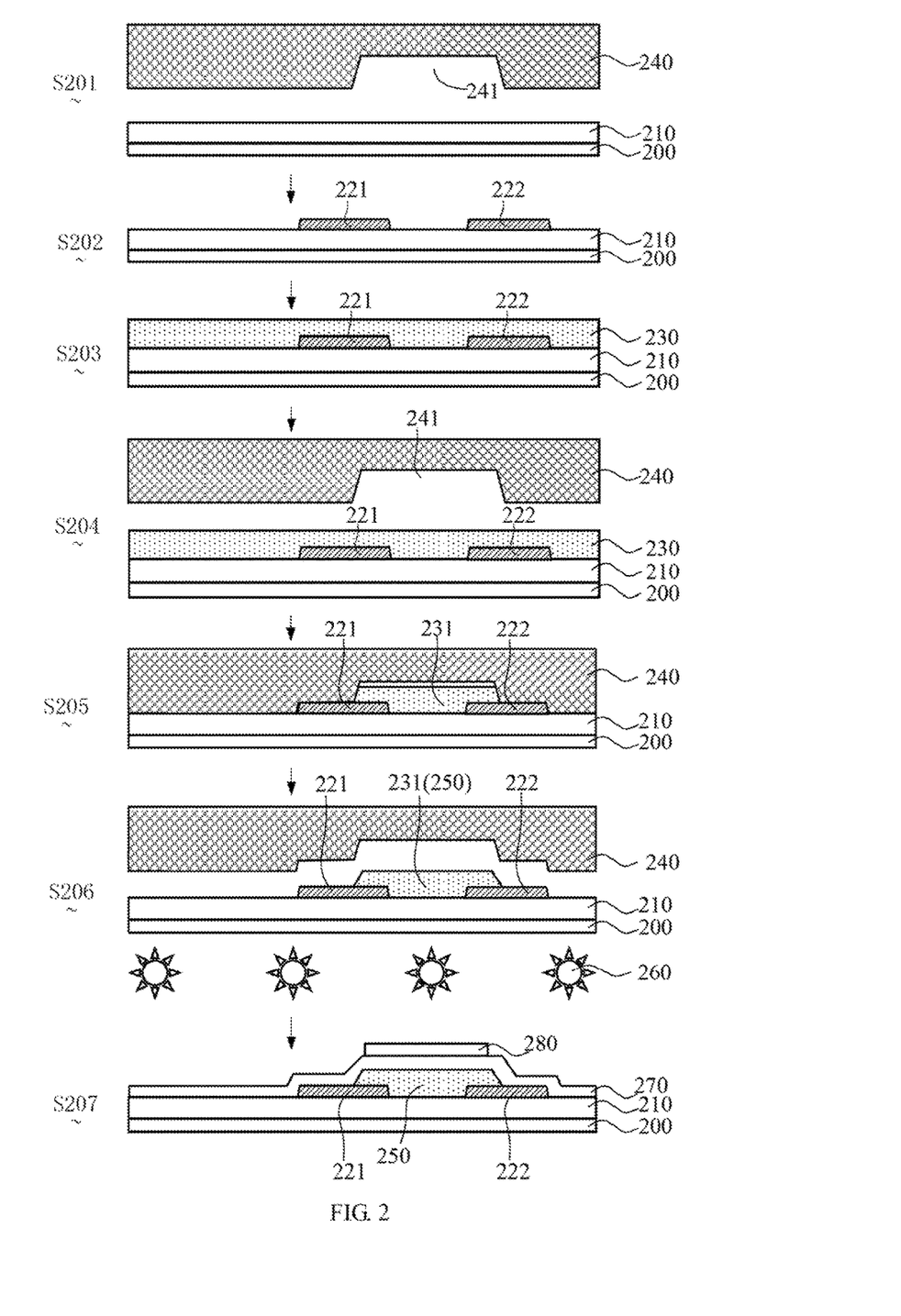
FIG 2 is a flow chart of an embodiment of a manufacturing method for a display panel according to the present disclosure, wherein the structures corresponding to each step are schematically illustrated.

Please refer to FIGS. 1-2. FIG. 1 is a flow chart of an embodiment of a manufacturing method for a display panel according to the present disclosure. FIG. 2 is a flow chart of an embodiment of a manufacturing method for a display panel according to the present disclosure, wherein the structures corresponding to each step are schematically illustrated. The display panel may be any display panel having the structure with thin film transistors, for example, the display panel may be an organic light emitted diode (OLED) display panel or a liquid crystal display panel or the like. In the present embodiment, an OLED display panel is described as an example. The OILED display panel includes thin film transistors, which are organic thin film transistors, and are top gate type organic thin film transistors in which the embodiment of the present disclosure focuses on the manufacturing process of the thin film transistors, the method includes the steps of:

Step S101: A baseplate and an embossing template are provided. The embossing template has recess portions having the same shape as a shape of a semiconductor channel layer.

The baseplate 210 and the embossing template 240 are provided in conjunction with step S201 as shown in FIG. 2. The baseplate 210 of the present embodiment is a flexible baseplate, and can be formed by a polyimide material. Specifically, a polyimide material is coated and cured on a glass substrate 200 to obtain a flexible baseplate 210 on the glass substrate 200.

The embossing template 240 has a pattern of semiconductor channel layers, i.e., the recess portions 241 having the same shape as that of the semiconductor channel layer, for trans-printing the pattern of the semiconductor channel layer onto the semiconductor solution material to form a semiconductor channel layer. The specific process will be described later.

Step S102: A source electrode layer and a drain electrode layer are formed on the baseplate.

Corresponding to step S202 in FIG. 2, the source electrode layer 221 and the drain electrode layer 222 correspond to the source and the drain of the thin film transistor, respectively, and are formed by a conductive material, for example, a conductive metal material.

Step S103: A semiconductor solution material is coated on the source electrode layer, the drain electrode layer, and a portion of the baseplate that is not covered by the source electrode layer and the drain electrode layer.

The semiconductor solution material is a semiconductor material having properties of the solution, which also has a certain fluidity, and may be a liquid or a semi-solid state. The semiconductor solution material may be, for example, a-si solution material. As shown in step S203 of FIG. 2, a semiconductor solution material 230 is formed on the baseplate 210, the source electrode layer 221, and the drain electrode layer 222, which is used to form the semiconductor channel layer.

Further, after step S103, the semiconductor solution material 230 may be pre-cured by baking to remove the excess semiconductor solution material and the semiconductor solution material 230 may be initially cured. It is to be understood that the pre-curing process only reduces the fluidity of the semiconductor solution material 230 and the pre-cured semiconductor solution material 230 still has the properties of the solution.

The pre-curing temperature may be, for example, 50 to 100° C., or 60 to 90° C.; and the heating time may be, for example, 60 to 100 seconds, or 80 to 120 seconds.

Step S104: When a predetermined position to form the semiconductor channel layer on the source electrode layer and the drain electrode layer is determined, the recess portions of the embossing template are aligned with the predetermined position.

As shown in step S204 of FIG. 2, after the predetermined position of the semiconductor channel layer on the source electrode layer 221 and the drain electrode layer 222 is determined, the recess portions 241 of the embossing template 240 is aligned with the predetermined position.

Step S105: The embossing template is pressed onto the semiconductor solution material to remove semiconductor solution material other than the semiconductor solution material located within the recess portions, thereby protrusions of semiconductor solution material are correspondingly formed in the shape of the recess portions.

The embossing template 240 is pressed against the semiconductor solution material 230 after the recess portions 241 are aligned with the source electrode layer 221 and the drain electrode layer 222 in accordance with step S205 of FIG. 2. A uniform pressure can be applied to one other surface of the embossing template 240 against the semiconductor solution material 230. Meanwhile, it is also possible to apply a uniform pressure on one another surface of the substrate 210 against the semiconductor solution material 230, to transfer the pattern on the embossing template 240 onto the semiconductor solution material 230.

Specifically, since the semiconductor solution material is a liquid material, when the embossing template 240 is pressed against the semiconductor solution material 230, the semiconductor solution material 230 located in the recess portions 241 is not pressed to be retained, the semiconductor solution material 230 other than the semiconductor solution material inside the recess portions 241 is extruded from the side between the embossing template 240 and the baseplate 210, and a portion of the semiconductor solution material 230 is removed to form the semiconductor material 230 and the protrusions 231 of the semiconductor solution material 230 corresponding to a shape of the recess portions 241.

The embossing template 240 has a certain elasticity and is deformed in accordance with the shape of the source electrode layer 221 and the drain electrode layer 222 during the extruding process, so that the semiconductor solution material other than the source electrode layer 221 and the drain electrode layer 222 is removed.

In the present embodiment, in order to facilitate the pressing, the alignment between the recess portions 241 of the embossing template 240 and the source electrode layer 221, the alignment between the recess portions 241 of the embossing template 240 and the drain electrode layer 222, and the process of pressing the embossing template 240 against the semiconductor solution material 230 are performed under vacuum conditions. In step S205 the force applied to the embossing template 240 and the substrate 210 may be the pressure drop caused by the evacuation.

Step S106: The protrusions are cured and the embossing template and the baseplate are separated to form the semiconductor channel layer on the source electrode layer and the drain electrode layer.

The protrusions 231 and the baseplate 210 are separated after curing the protrusions 231, so that the semiconductor channel layer 250 is formed on the source electrode layer 221 and the drain electrode layer 222 in accordance with the step S206 of FIG. 2.

The protrusions 231 may be cured by heating. For example, as shown in FIG. 2, the heat source 260 may uniformly heat the baseplate 210 on one other side of the baseplate 210 against the protrusions 231, thereby curing the protrusions 231 by heat transfer. The heating temperature and the heating time may be selected depending on the actual situation. For example, the heating temperature may be 80 to 120° C., or 100° C. or 110° C. The heating time may be in the range of 100 to 200 seconds, or 80 seconds or 100 seconds.

The embossing template 240 may be heated and cured under the baseplate 210 while the embossing template 240 is pressed against the semiconductor solution material 230.

Step S107: A first insulation layer and a gate electrode layer are sequentially formed on the semiconductor channel layer.

The thin film transistor of the present embodiment is a top gate type thin film transistor. The first insulation layer 270 and the gate electrode layer 280 are sequentially formed on the semiconductor channel layer 250 in accordance with step S207 of FIG. 2. The first insulation grid 270 is a gate dielectric insulation layer.

By the above steps, a thin film transistor can be formed.

In the present embodiment, the semiconductor channel layer 250 is formed on the semiconductor solution material by transferring the pattern of the semiconductor channel layer onto the semiconductor solution material by using the embossing template 240, comparative with conventional formation method of photolithography with photoresist, the present embodiment does not need to form a photoresist layer on the semiconductor solution material so as to avoid the erosion of the surface of the semiconductor channel layer by the photoresist layer and improve the quality of the semiconductor channel layer, so that the semiconductor channel layer can increase the reliability of the contact between the gate dielectric insulation layer, and the device performance is improved. In addition, since it is not necessary to use photoresist, it is possible to avoid the environmental safety problem caused by the use of the fluorine-base photoresist, and, the embossing template can be used repeatedly to reduce the material cost.

Further, after step S106, the surface of the substrate 210 and the semiconductor channel layer 250 is subjected to an etching process. The etching method may be various, for example, by plasma etching, or reactive ion etching (RIE). On one hand, the semiconductor solution material remaining on the surface of the baseplate 210 can be removed by etching treatment, and on the other hand, the surface of the semiconductor channel layer 250 can be made very smooth and the device performance can be further improved.

In the embodiment of the present disclosure, in order to facilitate the outflow of the semiconductor solution material, flow portions may be formed in the embossing template 240 or the baseplate 210 for allowing the semiconductor solution material 230 to be discharged from the flow portions, when the embossing template 240 is pressed against the semiconductor solution material 230. The flow portions may be holes or grooves. For example, holes may be provided in the embossing template 240 so that the semiconductor solution material 230 is extruded from the holes of the imprint template 240 to remove the semiconductor solution material 230, when the embossing template 240 may press the semiconductor solution material 230 other than the semiconductor solution material in the recess portion 241. Of course, the holes for ejecting the semiconductor solution material 230 may be provided on the baseplate 210, or may be provided both on the embossing template 240 and the baseplate 210.

Figure 3:
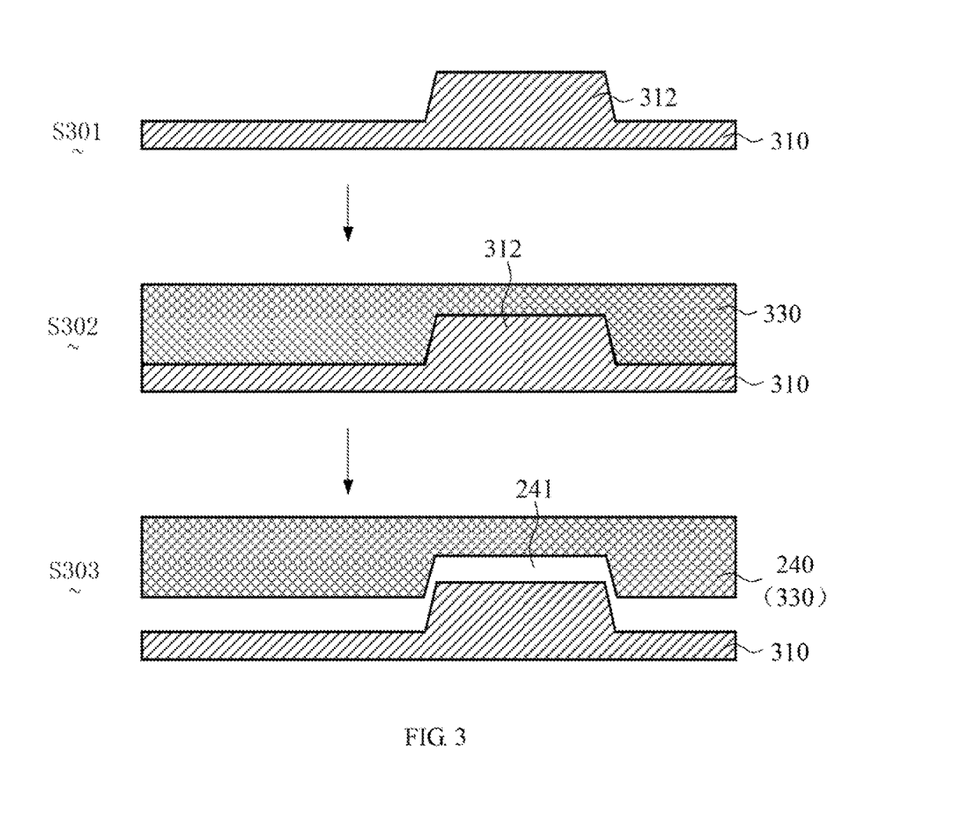
FIG. 3 is a flow chart of making an embossing template in a manufacturing method for a display panel according to the present disclosure, wherein the structures are schematically shown in the drawings.

Please refer to FIG. 3, in the embodiment of the present disclosure, the step of providing the substrate 210 and the embossing template 240 includes the step of forming an embossing template 240, wherein forming the embossing template 240 may include the steps of:

Step S301: A pattern 320 of a semiconductor channel layer is formed on the hard substrate 310. First, the desired semiconductor channel layer is determined, and then the hard substrate 310 can be engraved by Electron Beam Direct Writing (EBDW) to obtain a desired semiconductor channel layer on the hard substrate 310. The hard substrate 310 may be an Si/SiO$_2$ substrate, or a quartz substrate.

Step S302: The organic high molecular material 330 is coated on the hard substrate 310 on which the pattern 320 is coated and cured.

Optionally, the organic high molecular material 330 may be selected according to actual needs, for example, polydimethylsilaxane (PDMS).

Step S303: The cured organic high molecular material 330 is separated from the hard substrate 310. The cured organic high molecular material 330 is formed with the recess portions 241 corresponding to the shape of the pattern 320 to form the embossing template 240.

After the organic high molecular material 330 is released from the hard substrate 310, the organic high molecular material 130 is formed with a pattern opposite the pattern 320, that is, the recess portions 241, thereby forming the recess portions 241 on the embossing template 240.

The embossing template 240 has elasticity. The embossing template 240 may be formed by a rubber material.

By the present embodiment, the forming process of the embossing template 240 is made simple. And the embossing template 240 is formed by using an elastomeric material so that the embossing template 240 has a certain degree of elasticity, damage to the baseplate 210 caused by the pressing process embossing template 240 can be reduced.

Figure 4:
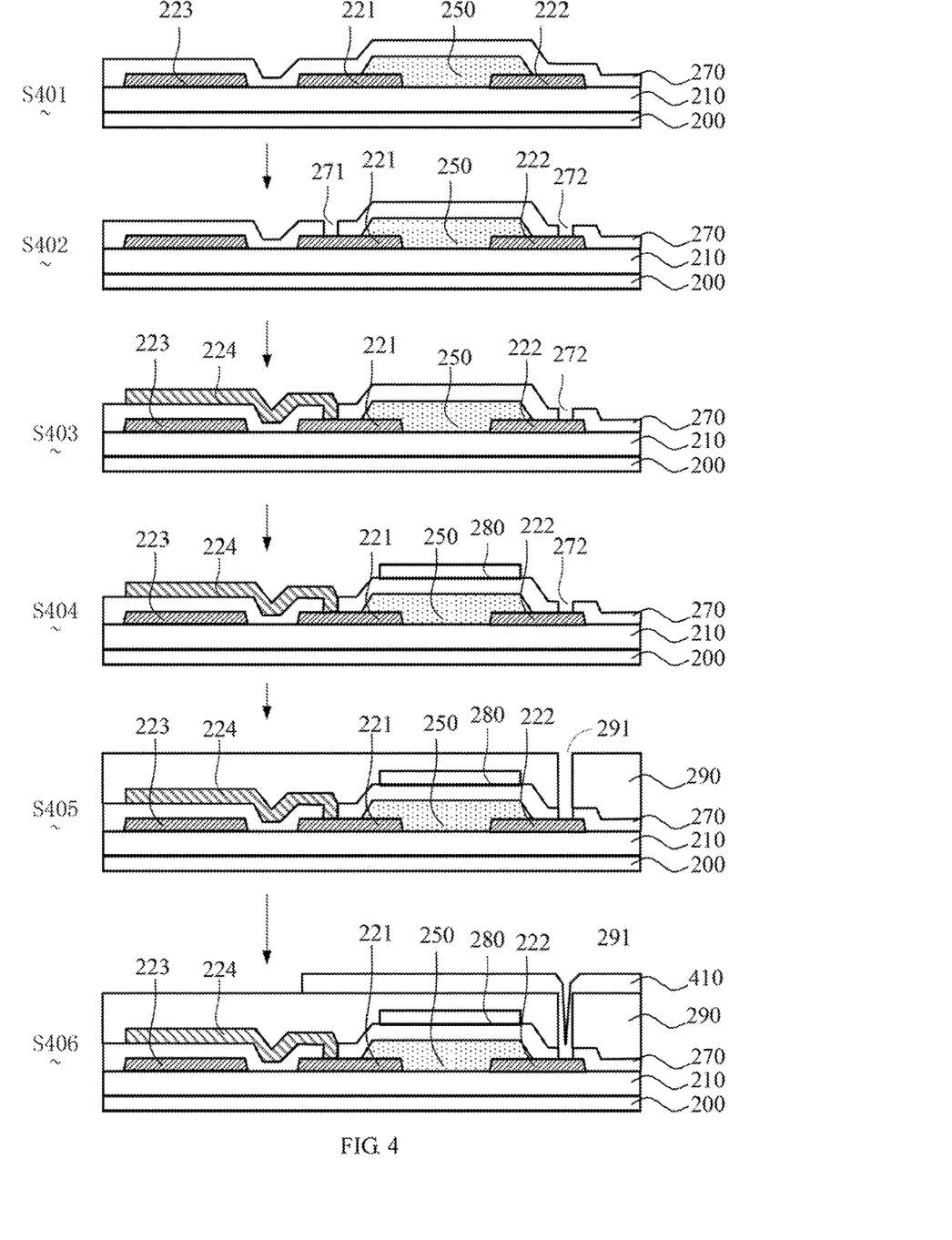
FIG. 4 is a flow chart after forming a semiconductor channel layer in an embodiment of the manufacturing method for a display panel according to the present disclosure, wherein the structures corresponding to each step are schematically shown in the figure.

FIG. 4 is a flow chart after forming, a semiconductor channel layer in an embodiment of the manufacturing method for a display panel according to the present disclosure, wherein the structures corresponding to each step are schematically shown in the figure. In the embodiment, when the source electrode layer 221 and the drain electrode layer 222 are formed on the baseplate 210, the capacitor lower plate 223 is also formed on the baseplate 210.

As shown in FIG. 4, in step S401, the first insulation layer 270 is formed on the semiconductor channel layer 250 and the source electrode layer 221, the drain electrode layer 222, the substrate 210, and the capacitor lower plate 223, which are not covered by the semiconductor channel layer 250.

In step S402, a first through hole 271 is formed in the first insulation layer 270 on the source electrode layer 221, and a second through hole 272 is formed in the first insulation layer 270 on the drain electrode layer 222.

In step S403, a capacitor upper plate 224 is formed on the first insulation layer 270 corresponding to the capacitor lower plate 223, and the capacitor upper plate 224 is connected to the source electrode layer 221 through the first through hole 271. The capacitor upper plate 223, the first insulation layer 270, and the capacitor lower plate 224 constitute the storage capacity of the display panel.

In step S404, a gate electrode layer 280 is formed on the first insulation layer 270 corresponding to the semiconductor channel layer 250.

In step S405, a second insulation layer 290 is formed on the gate electrode layer 280, and the first insulation layer 270 and the capacitor upper plate 224, which are not covered by the gate electrode layer 280, wherein the second insulation layer 290 is formed with a third through hole 291 connecting to the second through hole 272.

The second insulation layer 290 may consist of an inorganic passivation layer and an organic flat layer, or only consist of one layer of an inorganic passivation layer or an organic flat layer.

In step S406, a transparent electrode layer 410 is formed on the second insulation layer 290, and the transparent electrode layer 410 is successively connected to the drain electrode layer 222 through the third through hole 293 and the second through hole 272. The transparent electrode layer 410 serves as a pixel electrode of the display panel.

By way of the above, it is possible to form a thin film transistor array of the display panel.

The present disclosure also provides a method for producing a thin film transistor. The method for manufacturing a thin film transistor is the same as that of the thin film transistor in the embodiment shown in FIGS. 1 and 2, and for the sake of simplicity, do not go on here.

Although the present disclosure has been disclosed as preferred embodiments, the foregoing preferred embodiments are not intended to limit the present disclosure. Those of ordinary skill in the art, without departing from the spirit and scope of the present disclosure, can make various kinds of modifications and variations to the present disclosure. Therefore, the scope of the claims of the present disclosure must be defined.

What is claimed is:

1. A manufacturing method for thin film transistors, comprising:

providing a baseplate and an embossing template, the embossing template having recess portions having the same shape as a shape of a semiconductor channel layer;

forming a source electrode layer and a drain electrode layer on the baseplate;

coating a semiconductor solution material on the source electrode layer, the drain electrode layer, and a portion of the baseplate that is not covered by the source electrode layer and the drain electrode layer;

pre-curing a the semiconductor solution material;

when a predetermined position to form the semiconductor channel layer on the source electrode layer and the drain electrode layer is determined, aligning the recess portions of the embossing template with the predetermined position;

pressing the embossing template onto the pre-cured semiconductor solution material to remove semiconductor solution material other than the semiconductor solution material located within the recess portions, thereby correspondingly forming protrusions of semiconductor solution material to a shape of the recess portions, wherein the embossing template is deformed in accordance with a shape of the source electrode layer and a shape of the drain electrode layer during the formation of the protrusions;

curing the protrusions and separating the embossing template from the baseplate to form the semiconductor channel layer on the source electrode layer and the drain electrode layer;

etching a surface of the semiconductor channel layer and a surface of the baseplate;

sequentially forming a first insulation layer and a gate electrode layer on the semiconductor channel layer after the etching process.

2. The manufacturing method according to claim 1, wherein at least one of the baseplate and the embossing template is formed with flow-through portions so that the semiconductor solution material flows out from the flow-through portion when the embossing template is pressed onto the semiconductor solution material.

3. The manufacturing method according to claim 1, wherein the step of aligning the recess portions of the embossing template with the predetermined position comprises: aligning the recess portion of the embossing template with the predetermined position under vacuum conditions;
the step of pressing the embossing template onto the semiconductor solution material comprises: pressing the embossing template onto the semiconductor solution material under vacuum conditions.

4. The manufacturing method according to claim 1, wherein the step of providing a substrate and an embossing template comprises:
forming a pattern of the semiconductor channel layer on a hard substrate;
coating and curing an organic high molecular material on the hard substrate on which the pattern is formed; and
separating the cured organic high molecular material from the hard substrate, wherein the cured organic high molecular material is formed with the recess portions corresponding to the shape of the pattern to form the embossing template.

5. The manufacturing method according to claim 4, wherein the embossing template has elasticity.

6. The manufacturing method according to claim 1, wherein the step of curing the protrusions comprises a step of heating the protrusions on one back side of the baseplate against the protrusions is heated to cure the protrusions.

7. A manufacturing method for thin film transistors, comprising:
providing a baseplate and an embossing template, the embossing template having recess portions having the same shape as a shape of a semiconductor channel layer;
forming a source electrode layer and a drain electrode layer on the baseplate;
coating a semiconductor solution material on the, source electrode layer, the drain electrode layer, and a portion of the baseplate that is not covered by the source electrode layer and the drain electrode layer;
when a predetermined position to form the semiconductor channel layer on the source electrode layer and the drain electrode layer is determined, aligning the recess portions of the embossing template with the predetermined position;
pressing the embossing template onto the semiconductor solution material to remove semiconductor solution material other than the semiconductor solution material located within the recess portions, thereby correspondingly forming protrusions of semiconductor solution material to a shape of the recess portions, wherein the embossing template is deformed in accordance with a shape of the source electrode layer and a shape of the drain electrode layer during the formation of the protrusions;
curing the protrusions and separating the embossing template from the baseplate to form the semiconductor channel layer on the source electrode layer and the drain electrode layer;

sequentially forming a first insulation layer and a gate electrode layer on the semiconductor channel layer.

8. The manufacturing method according to claim 7, wherein after separating the embossing template from the baseplate, the manufacturing method further comprises: etching a surface of the semiconductor channel layer and a surface of the baseplate.

9. The manufacturing method according to claim 7, wherein after the step of coating a semiconductor solution material on the source electrode layer, the drain electrode layer, and a portion of the baseplate that is not covered by the source electrode layer and the drain electrode layer, the manufacturing method further comprises: pre-curing the semiconductor solution material.

10. The manufacturing method according to claim 7, wherein at least one of the baseplate and the embossing template is formed with flow-through portions so that the semiconductor solution material flows out from the flow-through portion when the embossing template is pressed onto the semiconductor solution material.

11. The manufacturing method according to claim 7, wherein the step of aligning the recess portions of the embossing template with the predetermined position comprises: aligning the recess portion of the embossing template with the predetermined position under vacuum conditions;
the step of pressing the embossing template onto the semiconductor solution material comprises: pressing the embossing template onto the semiconductor solution material under vacuum conditions.

12. The manufacturing method according to claim 7, wherein the step of providing a substrate and an embossing template comprises:
forming a pattern of the semiconductor channel layer on a hard substrate;
coating and curing an organic high molecular material on the hard substrate on which the pattern is formed; and
separating the organic high molecular material after curing from the hard substrate, the cured organic high molecular material is formed with the recess portions corresponding to the shape of the pattern to form the embossing template.

13. The manufacturing method according to claim 12, wherein the embossing template has elasticity.

14. The manufacturing method according to claim 7, wherein the step of curing the protrusions comprises a step of heating the protrusions on one back side of the baseplate against the protrusions is heated to cure the protrusions.

15. A manufacturing method for a display panel, the display panel comprising thin film transistors, the manufacturing method comprising:
providing a baseplate and an embossing template, the embossing template having recess portions having the same shape as a shape of a semiconductor channel layer;
forming a source electrode layer and a drain electrode layer on the baseplate;
coating a semiconductor solution material on the, source electrode layer, the drain electrode layer, and a portion of the baseplate that is not covered by the source electrode layer and the drain electrode layer;
when a predetermined position to form the semiconductor channel layer on the source electrode layer and the drain electrode layer is determined, aligning the recess portions of the embossing template with the predetermined position;
pressing the embossing template onto the semiconductor solution material to remove semiconductor solution material other than the semiconductor solution material located within the recess portions, thereby correspondingly forming protrusions of semiconductor solution material to the shape of the recess portions, wherein the embossing template is deformed in accordance with a shape of the source electrode layer and a shape of the drain electrode layer during the formation of the protrusions;

curing the protrusions and separating the embossing template from the baseplate to form the semiconductor channel layer on the source electrode layer and the drain electrode layer;

sequentially forming a first insulation layer and a gate electrode layer on the semiconductor channel layer.

16. The manufacturing method according to claim 15, wherein after separating the embossing template and the baseplate, the manufacturing method further comprises: etching a surface of the semiconductor channel layer and a surface of the baseplate.

17. The manufacturing method according to claim 15, wherein after the step of coating a semiconductor solution material on the source electrode layer, the drain electrode layer, and a portion of the baseplate that is not covered by the source electrode layer and the drain electrode layer, the manufacturing method further comprises: pre-curing the semiconductor solution material.

18. The manufacturing method according to claim 15, wherein at least one of the baseplate and the embossing template is formed with flow-through portions so that the semiconductor solution material flows out from the flow-through portion when the embossing template is pressed onto the semiconductor solution material.

19. The manufacturing method according to claim 15, wherein the step of aligning the recess portions of the embossing template with the predetermined position comprises: aligning the recess portion of the embossing template with the predetermined position under vacuum conditions;

the step of pressing the embossing template onto the semiconductor solution material comprises: pressing the embossing template onto the semiconductor solution material under vacuum conditions.

20. The manufacturing method according to claim 15, wherein the step of forming a source electrode layer and a drain electrode layer on the baseplate further comprises:

forming a capacitor lower plate on the baseplate;

the step of sequentially forming a first insulation layer and a gate electrode layer on the semiconductor channel layer, comprises:

forming the first insulation layer on the semiconductor channel layer and the source electrode layer, the drain electrode layer, the substrate, and the capacitor lower plate which is not covered by the semiconductor channel layer;

forming a first through hole in the first insulation layer on the source electrode layer and a second through hole in the first insulation layer on the drain electrode layer;

forming a capacitor upper plate on the first insulation layer corresponding to the capacitor lower plate and connecting to the source electrode layer through the first through hole;

forming the gate electrode layer on the first insulation layer corresponding to the semiconductor channel layer;

the step of sequentially forming a first insulation layer and a gate electrode layer on the semiconductor channel layer comprises:

forming a second insulation layer on the gate electrode layer, the first insulation layer not covered by the gate electrode layer, and the capacitor upper plate, and the second insulation layer being formed with a third through hole connecting to the second insulation layer;

forming a transparent electrode layer on the second insulation layer and connecting to the transparent electrode layer to the drain electrode layer successively through the third through hole and the second through hole.

* * * * *